United States Patent [19]

Schaumann

[11] 4,257,006
[45] Mar. 17, 1981

[54] INTEGRABLE ANALOG ACTIVE FILTER AND METHOD OF SAME

[75] Inventor: Rolf Schaumann, Minnetonka, Minn.

[73] Assignee: The Regents of the University of Minnesota, Minneapolis, Minn.

[21] Appl. No.: 6,438

[22] Filed: Jan. 25, 1979

[51] Int. Cl.³ .................. H03B 1/04; H03F 1/08; H03F 1/56; H03H 2/00

[52] U.S. Cl. .................. 328/127; 307/520; 330/107; 330/294; 333/213; 328/167

[58] Field of Search .......... 330/107, 109, 294; 328/127, 167; 333/213, 214; 307/233, 304

[56] References Cited

U.S. PATENT DOCUMENTS

| | | | |
|---|---|---|---|
| 3,401,352 | 9/1968 | Mitra | 330/107 X |
| 3,643,173 | 2/1972 | Whitten | 330/107 X |
| 3,805,178 | 4/1974 | Rollett | 330/107 |
| 3,904,978 | 9/1975 | Daniels et al. | 330/109 |
| 3,946,328 | 3/1976 | Boctor | 328/167 X |
| 4,001,712 | 1/1977 | Chambers et al. | 330/107 X |
| 4,156,853 | 5/1979 | Peterson | 330/109 |

Primary Examiner—John S. Heyman
Attorney, Agent, or Firm—Peterson, Palmatier, Sturm & Sjoquist, Ltd.

[57] ABSTRACT

Integrable analog active filter suitable for MOS monolithic implementation. The filter utilizes only integrating amplifiers and ratioed capacitors thus being implementable in MOS technology and compatible for use in MOS digital systems. Filters of unlimited complexity and having arbitrary transfer functions can be implemented by the integrable analog active filter.

8 Claims, 8 Drawing Figures

INTEGRABLE ANALOG ACTIVE FILTER AND METHOD OF SAME

The Government has rights in this invention pursuant to Grant No. NSF ENG 76-11218 awarded by the National Science Foundation.

BACKGROUND OF THE INVENTION

1. Field of the Invention

The present invention relates generally to analog active filters, and more particularly, pertains to integrable analog active filters utilizing only integrating amplifiers and ratioed capacitors.

2. Description of the Prior Art

Recently, there has been considerable interest in the development of active filters suitable for fully integrated monolithic implementation. Standard active RC filter design has not been normally useful for full integration because of the need for capacitors which are too large for integrated circuit technology.

Active R filters have received attention because they use integrating amplifiers, no capacitors, and establish filter parameters via ratios of resistors. Active R filters employ capacitors for only internal amplifier compensation. In active R filters, amplifiers are used as integrators and filter parameters such as pole frequency, quality factor, and gain are established with resistor ratios. Active R filters have the advantage of being suitable for operation over wide ranges of frequency, audio to video, but are prone to drifts, and use relatively large amounts of silicon area. Although the active R filters are easy to realize in integrated circuit technology, resistor ratios are less advantageous than ratios of capacitors for integrated circuit implementation, especially in MOS form.

Sampled-data analog switched-capacitor filters in which resistors are simulated via switched capacitors have been shown to perform very well at low frequencies but operation at high frequencies is far less than satisfactory because of problems associated with the need for very high switching frequency to avoid aliasing, with switching noise, and with the finite charging and discharging time of the capacitors. At the high frequencies, the internal amplifier dynamics introduce additional poles and phase shifts giving rise in switched-capacitor filters to the same problems encountered in active RC filters at the high frequencies.

With few exceptions, none of them useful for MOS implementation, filters which have been fully implemented in integrated form to date are either digital in nature or belong to the class of sampled data filters, such as switched-capacitor circuits. None of the prior art filters are readily integrable in MOS technology, and, thus, lack compatibility with modern integrated digital signal processing systems.

The integrable analog active filter proposed in this invention avoids most of the problems of the prior art filters.

SUMMARY OF THE INVENTION

The general purpose of the present invention is to provide an integrable analog active filter which in addition to utilizing integrating amplifiers utilizes only ratios of small capacitors for the synthesis of filter transfer functions.

According to one preferred embodiment of the present invention, there is provided an integrable analog active filter of at least second order having two integrating amplifiers connected to a loop and ratioed capacitors connected between the output and the input of the first amplifier, between the output of the second amplifier and the input of the first amplifier, and to the input of the first amplifier whereby said ratioed capacitors connected across the integrating amplifiers provide an MOS integrable analog active filter.

It is a principal object of the present invention to provide an integrable analog active filter implementable as a fully monolithic analog active filter, especially in MOS technology, utilizing MOS amplifiers and ratios of MOS capacitors. Implementations using only MOS transistors and capacitors are also possible. The resistors necessary for biasing and direct current stabilization can be realized with MOS transistors or via a leaky dielectric, and are thus compatible with MOS technology.

A further object of the present invention is an invention which is equally well suited for low frequency and for high frequency analog active filters. Further advantages of the invention are the ratios of the capacitors utilize less silicon area than resistor ratios; the capacitors are more accurate and less prone to drift due to temperature, voltage level, and aging; the capacitors are small, down to values where parasitics become significant; in carefully designed monolithic realizations, capacitors of fractions of picofarads are feasible, parasitic capacitors can be readily accounted for by absorbing the same into existing capacitors. Also, the circuit internal amplifier loads are negligible until very high frequency operation is reached. Further, the noise performance of the integrable analog active filter is superior because of the elimination of circuit resistors.

An additional object of the present invention is to provide an integrable analog active filter, thus eliminating all switchng circuitry, timing functions, biasing problems, and switching noise. Also, the integrable analog active filter is more suitable for high frequency operation by eliminating switching problems, difficulties related to capacitor charging and discharging times, and by including the major amplifier "parasitic", the gain rolloff, directly into the design procedure.

Applications of the present invention are integrable, technology-compatible, band limiting filters for sampled-data or digital signal processing applications; further applications are in high-precision filtering needs in low and high frequency analog communications.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein.

DESCRIPTION OF PREFERRED EMBODIMENTS

Figure 1:
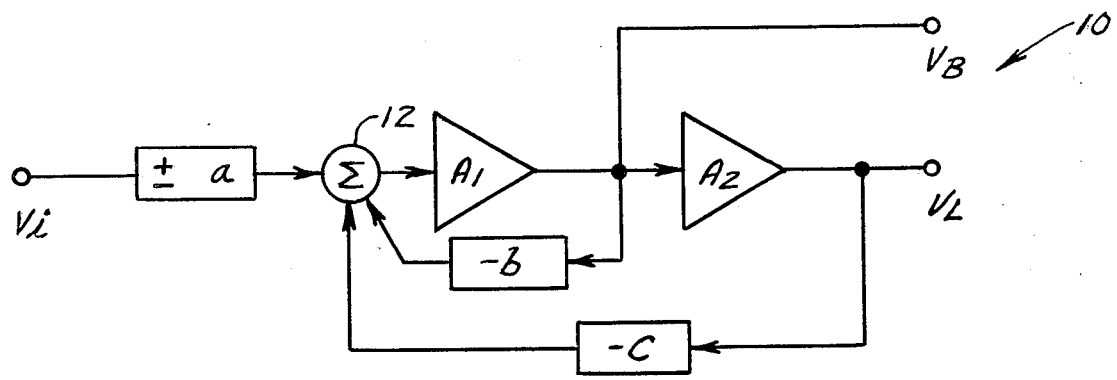
FIG. 1 illustrates a general "two-integrator" class circuit.

The state-variable-derived topology of the circuit 10 of FIG. 1 yields the equations $$T_B = V_B/V_i = \pm aA_2^{-1}/[(A_1A_2)^{-1} + bA_2^{-1} + c] \quad \text{eq. 1a}$$

$$T_L = V_L/V_i = \pm a/[(A_1A_2)^{-1} + bA_2^{-1} + c] \quad \text{eq. 1b}$$

where constants a, b, and c are implemented via the capacitor ratios as later described.

The two amplifiers, $A_1$ and $A_2$, are identical and described by the single-pole function for the gain $$A_1 = A_2 = A(s) = \frac{GB}{s+\sigma} e^{-s\tau} \approx \frac{GB}{s} e^{-s\tau} = \frac{1}{S} e^{-ST} \quad \text{eq. 2}$$

where GB is the gain-bandwidth product, $\sigma$ the 3dB-frequency, and the "excess phase" term $\exp(-s\tau)$ accounts for the effect of additional poles and zeros of A(s). If the two amplifiers $A_1$ and $A_2$ are not identical, the result is not significantly different. Since the frequency of operation, $\omega$, satisfies $\omega >> \sigma$, the amplifiers are ideal integrators in a normalized frequency parameter $S=s/GB$, and T is defined as $T=\tau GB$. Where $T=0$, eqs. 1 and 2 indicate that the circuit configuration of FIG. 1 yields the bandpass and low pass functions $$T_B = \pm aS/(S^2 + bS + c) \quad \text{eq. 3a}$$

$$T_L = \pm a/(S^2 + bS + c) \quad \text{eq. 3b}$$

Figure 2A:
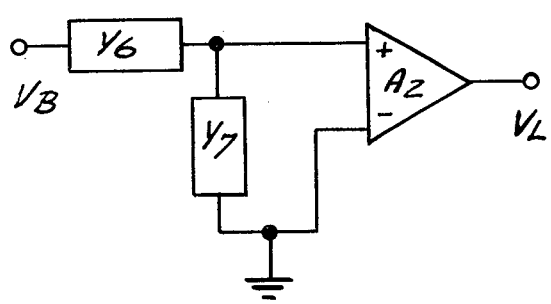
FIGS. 2a and 2b illustrate implementations of integrator $A_2$ of FIG. 1.
Figure 2B:
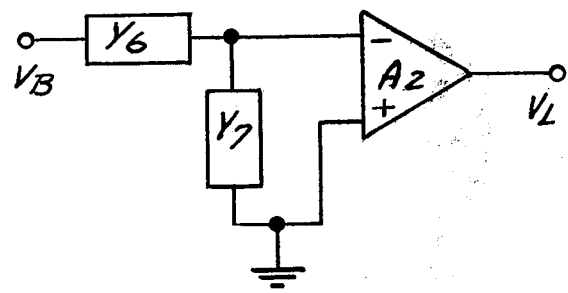
Figure 3A:
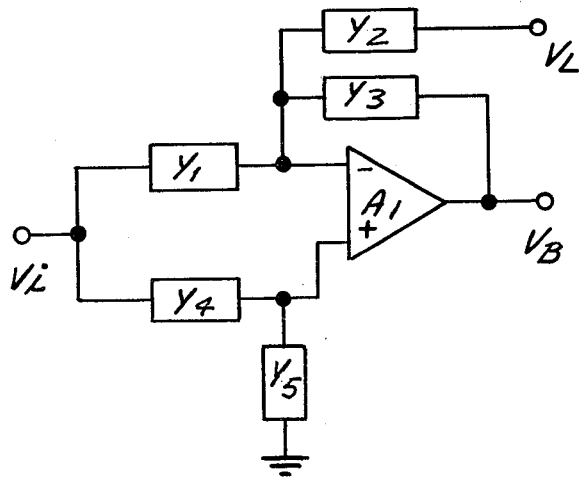
FIGS. 3a and 3b illustrate implementations of integrator $A_1$ and of the summer of FIG. 1.
Figure 3B:
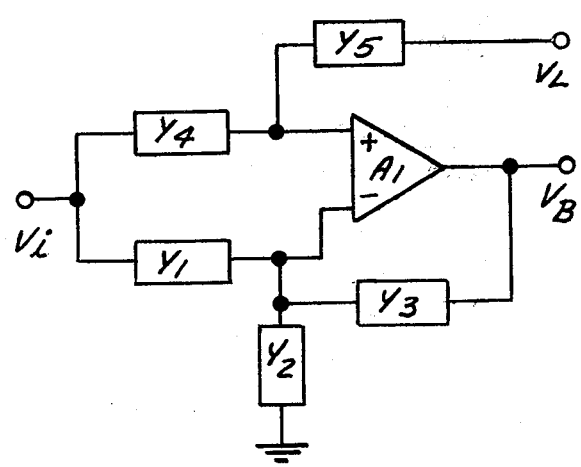

The actual implementation of the block diagrams of FIG. 1 realizes the circuits of FIGS. 2a and 2b which are considered for amplifier $A_2$ and the circuits of FIGS. 3a 3b for the amplifier $A_1$, including the summer 12.

The circuit in FIG. 2a realizes, with equation 2 and $T=0$, $$V_L = c_2 S^{-1} V_B \quad \text{eq. 4}$$

where $$c_2 = Y_6/(Y_6 + Y_7) \quad \text{eq. 5}$$

Similarly, for FIG. 2b, $V_L = -c_2 S^{-1} V_B$.
FIG. 3a yields $$V_B(S+b) = (a_1 - a_2)V_i - c'V_L \quad \text{eq. 6}$$

with $$a_1 = Y_4/(Y_4+Y_5) \; a_2 = Y_1/(Y_1+Y_2+Y_3) \quad \text{eq. 7}$$

$$b = Y_3/(Y_1+Y_2+Y_3) \; c'|c_{11} = Y_2/(Y_1+Y_2+Y_3)$$

where $Y_1 - Y_7$ are admittances.

Similarly, FIG. 3b is described by equations 6 and 7 where $$c' = -c_{12} = -Y_5/(Y_5+Y_4) \quad \text{eq. 8}$$

Thus, second-order filters are realized by connecting FIGS. 2a and 3a, or FIGS. 2b and 3b.

Figure 4A:
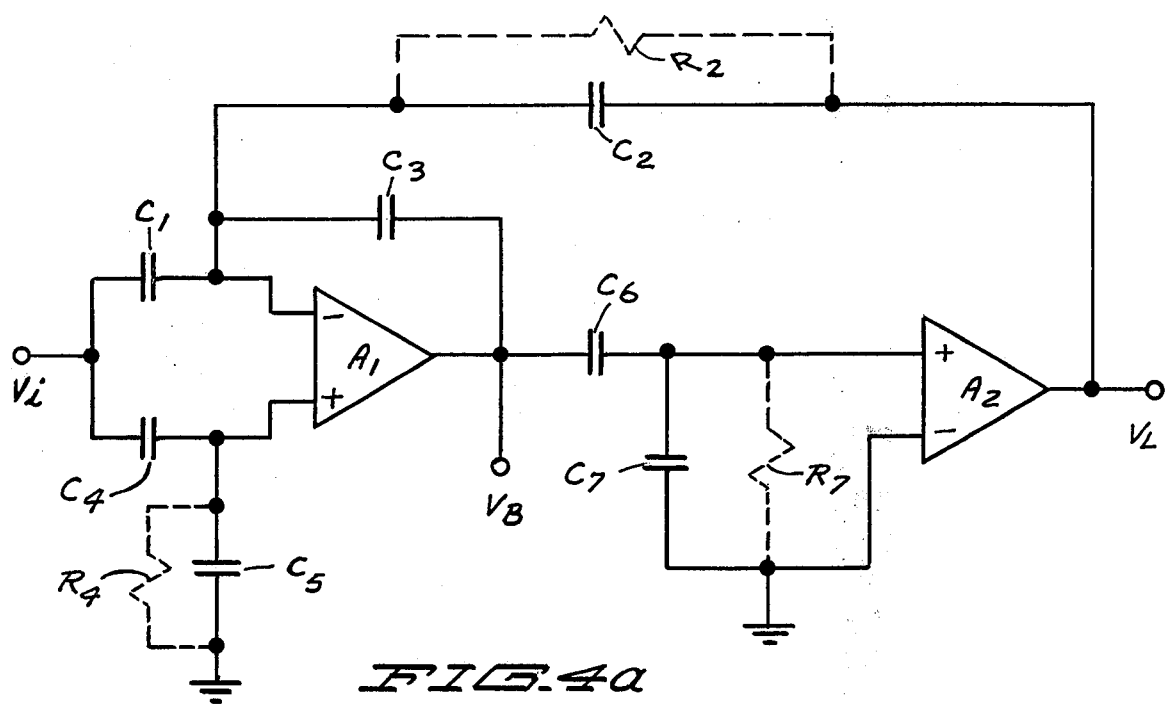
FIGS. 4a and 4b illustrate possible embodiments of integrable analog active all-capacitor filters.
Figure 4B:
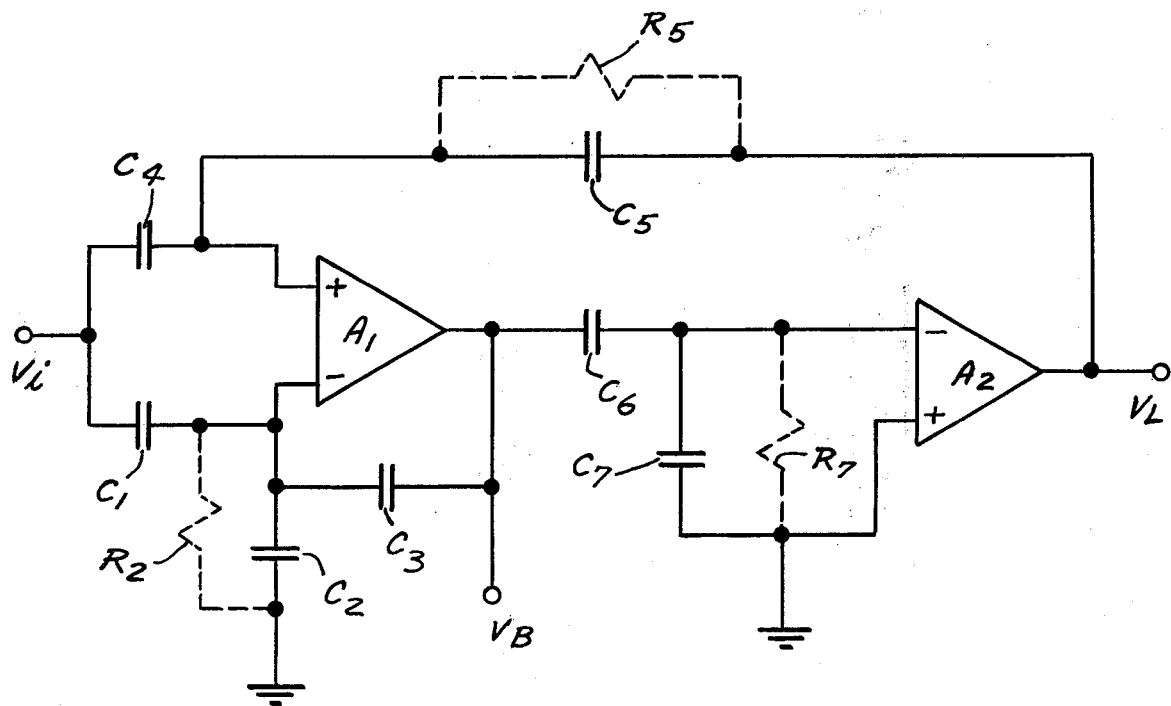

All filter parameters are determined by ratios of admittances which, especially in integrated circuit form, can be implemented conveniently with ratios of small capacitors. Thus from FIGS. 2a and 3a, and, respectively, from FIGS. 2b and 3b, the two all-capacitor active filter structures in FIGS. 4a and 4b are obtained; FIG. 4a yields $$T_B = (a_1 - a_2)S/(S^2 + bS + c_{11}c_2) \quad \text{eq. 9a}$$

$$T_L = (a_1 - a_2)c_2/(S^2 + bS + c_{11}c_2) \quad \text{eq. 9b}$$

and FIG. 4b:

$$T_B = (1 - a_2)S/(S^2 + bS + c_{12}c_2) \quad \text{eq. 10a}$$

$$T_L = -(a_1 - a_2)c_2/(S^2 + bS + c_{12}c_2) \quad \text{eq. 10b}$$

The capacitor ratios $a_k$, b, $c_{1k}$, $c_2$, k=1, 2, are given by equations 5, 7, and 8 with $Y_i = sC_i$.

The resistors $R_2$, $R_4$, and $R_7$ of FIG. 4a and $R_2$, $R_5$, and $R_7$ of FIG. 4b illustrated with dashed connections in FIGS. 4a and 4b respectively provide bias currents to the amplifier inputs and implement direct current feedback for stability. Their exact values are not critical; the resistors are chosen large, and in monolithic form, are implemented with pinched resistors, as spreading resistance, via a leaky dielectric or as suitably biased transistors.

The circuits in FIGS. 4a and 4b yield second-order lowpass and bandpass filters of positive or negative gain. Biquadratic transfer functions are available at the inverting input terminals of amplifier $A_1$ in FIGS. 4a and 4b.

The following considers only the circuit of FIG. 4a described by equations 9a and 9b with 5 and 7, as FIG. 4b is similar to FIG. 4a. The illustration of FIG. 4b is completely analogous to FIG. 4a.

From equations 9a and 9b, $$\Omega_o^2 \equiv (\omega/GB)^2 = c_{11}c_2, \; \Omega_o/Q = b \quad \text{eq. 11}$$

where $\omega_o$ is the pole frequency and Q the pole quality factor. Thus, with equations 5 and 7, $$(\Omega_o Q)^{-1} = b/(c_{11}c_2) = (C_3/C_2)(1 + C_7/C_6) \quad \text{eq. 12a}$$

$$(C_1+C_2)/C_3 = Q/\Omega_o - 1 \quad \text{eq. 12b}$$

Further, from equations 9a and 9b, respectively, the mid-band gain $H_B$ and direct current gain $H_L$ equal $$H_B = (a_1-a_2)/b, \; H_L = (a_1-a_2)/c_{11} \quad \text{eq. 13}$$

Depending on whether the desired gain is positive or negative, equation 13 together with equation 12 can be solved for the necessary capacitor ratios.

For example, a bandpass filter with negative gain results in $a_1 = 0$ where $C_4 = 0$, $C_5 = \infty$. From equation 13, $H_B = -a_2/b = -C_1/C_3$. For this type of filter, the capacitor ratio equations with equation 12 are $$C_1/C_3 + = -H_B \; (H_B < 0) \quad \text{eq. 14a}$$

$$C_2/C_3 = Q/\Omega_o - 1 + H_B \quad \text{eq. 14b}$$

$$C_7/C_6 = (Q\Omega_o - 1 + H_B)/(\Omega_o Q) - 1 \quad \text{eq. 14c}$$

A simplification of the circuit is obtained by setting $c_2 = 1$ where $C_6 = \infty$, $C_7 = 0$. This eliminates two capacitors and results in the capacitor ratio equations $$C_1/C_3 = Q/\Omega_o - 1 - \Omega_o Q \quad \text{eq. 15a}$$

$$C_2/C_3 = \Omega_o Q \qquad \text{eq. 15b}$$

The values of $\Omega_o$, Q and $H_B$ are inserted into equations 11-15 for a correct design. In this choice of parameters, the amplifiers' excess phase, $-\Omega T$, introduced in equation 2, is taken into account. The effects are analyzed by inserting equation 2 into equation 1a where $$T_B(S) = \frac{\pm a \cdot S \exp(-ST)}{S^2 + b S \exp(-ST) + c \exp(-2 ST)} \qquad \text{eq. 16}$$

The phase term in the numerator of equation 16 adds to the total phase of $T_B(S)$. The exponential terms in the denominator are shown to give rise to Q and gain enhancement, and to a small perturbation of the pole frequency according to $$\Omega_R = \Omega_o(1+\Omega_R T/2Q_R) \approx \Omega_o \qquad \text{eq. 17a}$$

$$Q_R \approx Q/(1-2Q\Omega_R T) \qquad \text{eq. 17b}$$

$$H_{BR} \approx H_B/(1-2Q\Omega_R T) \qquad \text{eq. 17c}$$

where $\Omega_R$, $Q_R$ and $H_{BR}$ are the realized parameters and $\Omega_o$, Q and $H_B$ the designed ones. Equations 17a-c then provides the predistorted values $\Omega_o$, Q and $H_B$ to be used in equations 12a, 12b, 13, 14a-14c, 15a and 15b which for a given T result in $\Omega_R$, $Q_R$ and $H_{BR}$. The approximations are valid for $4Q_R^2 >> 1$ and $2Q_R >> \tan \Omega_R T$.

The sensitivity of a filter parameter k to an element x, $S_x^k = (dk/k)/(dx/x)$, is determined from equations 11 and 13 with equations 5, 7 and 8. Specifically one obtains $$S_{GB}^{\omega_o} = 1; \; S_{GB}^Q = S_{GB}^{H B} = S_{GB}^{H L} = 0$$

and $$S_r^{\Omega_o} = 0.5 \; ; \; |S_r^Q| \leq 1 \; ; \; |S_r^{gain}| \leq 1$$

where r represents the capacitor ratios $a_1$, $a_2$, b, $c_{11}$, and $c_2$. Thus, the circuit of FIG. 4a illustrates an excellent sensitivity behavior, with very low sensitivities to the accurate and stable capacitor ratios r. Where $S_{GB}^{\omega_o} = 1$, $\omega_o$ is proportional to GB, and GB must be carefully controlled and stabilized when precision filters are required.

SPECIFIC EXAMPLE OF OPERATION

Figure 5:
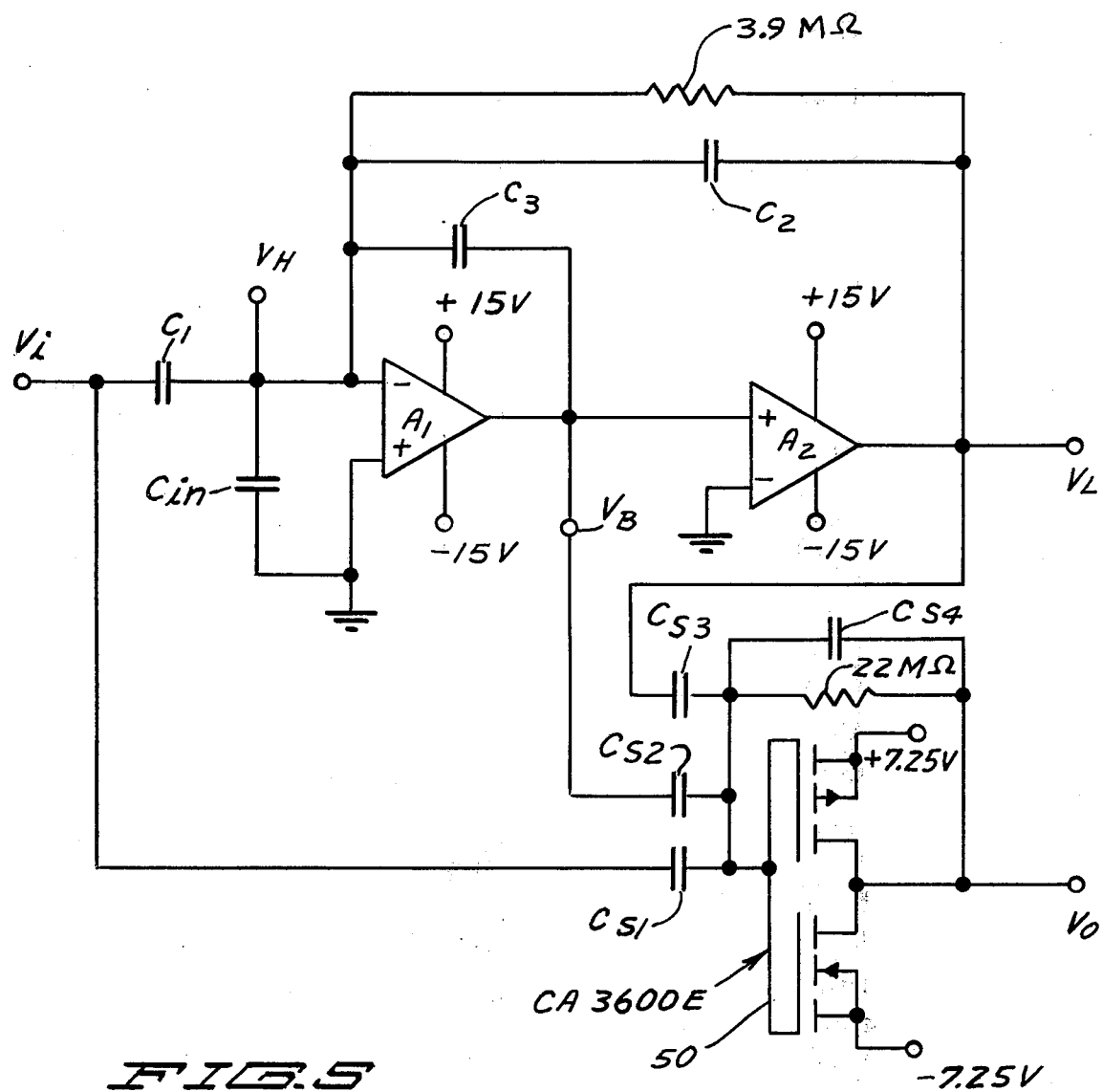
FIG. 5 illustrates a special case of the implementation in FIG. 4a with an added MOS output summing circuit.

The filter performance is illustrated by the circuit in FIG. 5, a special case of the implementation of FIG. 4a with an added MOS output summing circuit 50. The transfer function $V_B/V_i$ and $V_L/V_i$ are described by equations 9a and 9b with equations 15a and 15b where $C_4 = C_7 = 0$ and $C_5 = C_6 = \infty$. Further, $V_H$ is a highpass output, resulting in $$T_H = V_H/V_i = a_2 S^2/(S^2 + bS + c_{11}) \qquad \text{eq. 18}$$

and $V_o$, derived from a buffered summer 50 using a CA3600 CMOS Integrated Circuit, given a biquadratic transfer function, $$T_o = \frac{V_o}{V_i} = h \frac{S^2 + (b - d_2 a_2)S + (c_{11} - d_3 a_2)}{S^2 + bS + c_{11}} \qquad \text{eq. 19}$$

which can realize allpass, notch, or highpass filters. The latter one, however, buffered or unbuffered, is more conveniently implemented at the terminal $V_H$. In equation 19, $h = C_{s1}/C_{s4}$, $d_i = C_{si}/C_{s1}$, $i = 2,3$, and the gain of the CMOS inverter is assumed to be infinite. The difference introduced by this assumption is adjusted by $C_{s4}$.

Using equations 9a and 9b, 15a and 15b, 17a, 17b, and 17c, and 19, a bandpass and a notch filter were designed for the parameters $f_o = 900$ kHz and $Q_R = 15$. Using GB$\approx 2\pi \cdot 3$ MHz, $\tau \approx 17$ ns, and $C_{in} \approx 4$ pF results in the capacitors $C_1 = 27$ pF, $C_2 = 3.3$ pF, $C_3 = 3$pF, $C_{s1} = 7.7$ pF, $C_{s2} = 0.22$ Pf, $C_{s4} = 5.5$ pF and $C_{s3} = 0$. The response resulted in predicted behavior.

Similarly, a lowpass and highpass filter were designed for the parameters $f_{3dB} = 1$ MHz and $Q_R = 1/\sqrt{2}$. The response obtained with the capacitor values $C_1 = 7.38$ pF, $C_2 = 3.3$ pF and $C_3 = 15$ pF was in agreement with theory.

SUMMARY

The integrable analog active filter can be manufactured as a MOS integrated circuit with the ratioed capacitors implemented into the integrated circuit structure.

The process of connecting ratioed capacitors across integrated circuit integrating amplifiers has been clearly set forth in the previous paragraphs. Ratioed capacitors are easily implemented in MOS integrating circuitry.

The integrable analog active filter is dependent on the parameter GB which can be stabilized in integrated circuit form. Stabilization, of course, is not critical in one useful and highly important application requiring analog, and preferably integrable circuits, that of antialiasing band limiting filters in sampled-data or digital signal processing systems.

The filters can be made tunable or adjustable in discrete steps or continuously by switching into or out of the circuits different values of capacitors and-or by varying the integrator gains.

Various modifications can be made to the integrable analog active filter of the present invention without departing from the apparent scope thereof. The integrable analog active filters from the second order filters disclosed in this patent application by way of example and for purposes of illustration only, can be extended to high-order filters via simulated ladders or multiple feedback topologies.

Having thus described the invention, what is claimed is:

1. An active analog filter consisting, essentially, in combination;
   input and output terminals adapted for connection to a source of signal and signal utilization means; and
   integrating means effectively free of resistors in performing the integrating operation interconnecting said input and output terminals, said integrating means including amplifier means and reactance means exhibiting resistorless capacitance characteristics.

2. The subject matter of claim 1 in which the reactance means includes a plurality of capacitors having interrelated values.

3. The subject matter of claim 1 in which further reactance means and signal combining means are connected intermediate the input terminal and said amplifier means and further reactance means are connected intermediate the output terminal and said signal combining means, all of said reactance means having interrelated magnitudes.

4. The subject matter of claim 3 in which the integrating means includes at least a pair of amplifier means and each of said amplifier means is connected to said signal combining means through a further reactance means.

5. The method of processing predetermined frequency components of an analog signal comprising the steps of;
- providing a plurality of reactance means exhibiting resistorless capacitive characteristics;
- providing a signal combining means;
- providing a signal integrating means effectively free of resistors in performing the integrating operation;
- passing a signal through one of said reactance means, said signal combining means and said integrating means while simultaneously passing a signal from said integrating means to said signal combining means.

6. The method of claim 5 in which the reactance means are selected to have interrelated magnitudes.

7. The method of claim 6 in which the signal is passed through a plurality of integrating means.

8. The method of claim 7 in which the signal is passed through a successive plurality of integrating means.

* * * * *

UNITED STATES PATENT OFFICE
CERTIFICATE OF CORRECTION

Patent No. 4,257,006      Dated March 17, 1981

Inventor(s) Rolf Schaumann

It is certified that error appears in the above-identified patent and that said Letters Patent are hereby corrected as shown below:

Column 2, line 22, the middle "the" should be --that--.

Column 4, line 10, "$T_B = (1-a_2)$" should be --$T_B = (a_1-a_2)$--.

Column 4, line 36, "$\Omega_0^2 \equiv (\omega/GB)^2$" should be --$\Omega_0^2 \equiv (\omega_o/GB)^2$--.

*Signed and Sealed this*

*Twenty-third* Day of *June 1981*

[SEAL]

*Attest:*

RENE D. TEGTMEYER

*Attesting Officer*     *Acting Commissioner of Patents and Trademarks*